United States Patent [19]

Hiscock et al.

[11] 4,141,161
[45] Feb. 27, 1979

[54] REDUCED POWER INCANDESCENT BAR TYPE DISPLAY DEVICE

[75] Inventors: Benjamin E. Hiscock; Zygmund Reich, both of Burlington, Vt.

[73] Assignee: Simmonds Precision Products, Inc., Tarrytown, N.Y.

[21] Appl. No.: 817,064

[22] Filed: Jul. 19, 1977

[51] Int. Cl.² ............................................. G09F 13/00
[52] U.S. Cl. ...................................... 40/547; 40/452; 340/757; 340/380
[58] Field of Search .................... 40/447, 450–452, 40/546, 547, 550; 340/380 R, 336, 166 EL, 168 S, 366 E, 225, 107

[56] References Cited

U.S. PATENT DOCUMENTS

| 2,619,068 | 11/1952 | Malheiros | 340/380 |
| 2,890,445 | 6/1959 | Korry | 340/366 E |
| 3,581,307 | 5/1971 | McKim | 340/380 |

*Primary Examiner*—Louis G. Mancene
*Assistant Examiner*—G. Lee Skillington
*Attorney, Agent, or Firm*—Edwin E. Greigg

[57] ABSTRACT

A bar display comprising incandescent segmented display module presenting a plurality of dot positions to the viewer wherein a plurality of miniature incandescent lamps illuminate all the segments except one, the latter segment being illuminated by an elongated incandescent lamp capable of illuminating not only this one remaining segment but all segments or supplementing the miniature lamps depending on ambient light conditions. This arrangement permits a fully lighted dot position bar display with only one lamp thus saving power or permits a dot position bar display with each individual miniature lamp illuminated separately or a bar display responding to ambient lamp conditions, by utilizing only the elongated lamp alone or the elongated lamp plus the miniature lamps as desired.

3 Claims, 4 Drawing Figures

REDUCED POWER INCANDESCENT BAR TYPE DISPLAY DEVICE

BACKGROUND OF THE INVENTION

In bar displays, the prior art systems generally are mechanical and consist of an electro-mechanically driven tape similar to a motion-picture projector with the scale viewed through a slot-type window. The display driven by a motor is subject to wear and shock vibration and thus, suffers from poor reliability and high maintenance attendant with such mechanical drives.

Also existing known displays utilizing incandescent lamps, while arranged to be individually lighted so as to present either a bar or a dot type scale, no attempt has been made to provide such lights with a means to respond to ambient light conditions, i.e., less light output under a low light ambient condition such as at night and much more light under high light ambient conditions such as in daylight. Further, no attempt has been made heretofore to provide a means of controlling the amount of power utilized by the bar display.

Accordingly, it is an object to this invention to provide a bar display which has the following advantages:

Utilization of less power to light a full display,

Utilization of a modular concept to allowing varying display bar lengths,

Extended life of the display because of the ability to control the use of the lights in the display, Diversity of presenting a single segment or a full bar display, Control the visibility under various ambient light conditions, and finally, Ability to present a color display as well as provide a display with small size and low weight.

SUMMARY OF THE INVENTION

The display which fulfills the foregoing objects of the invention and gains the advantages thereof comprises:

a bar display including an elongated insulating member attached to an elongated heat sink member which supports a plurality of plastic segments stacked one on top of the other to form the bar display. The insulating member contains the leads for a plurality of miniature incandescent lamps and an elongated lamp within the heat sink member. The elongated incandescent lamp extends the length of the heat sink member transverse the miniature incandescent lamps so as to provide background light to all of the segments to be illuminated while the miniature incandescent lamps light all the segments individually except one, the latter being lit by the elongated lamp. The segments are arranged to transmit light from the incandescent lamps and to form dot positions in a linear arrangement as the bar display and the incandescent lamps are connected to connectors in the insulating member so as to be powered independently of one another and independently of the elongated incandescent lamp or conversely to be lit concurrently with or without the incandescent lamp as desired.

DESCRIPTION OF THE PREFERRED EMBODIMENT

Figure 1:
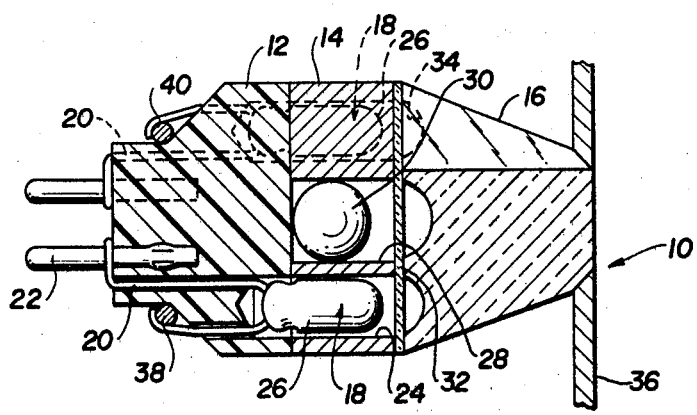
FIG. 1 is an elevational view partly in section showing the inner details of the modular display made in accordance with the teachings of this invention.
Figure 2:
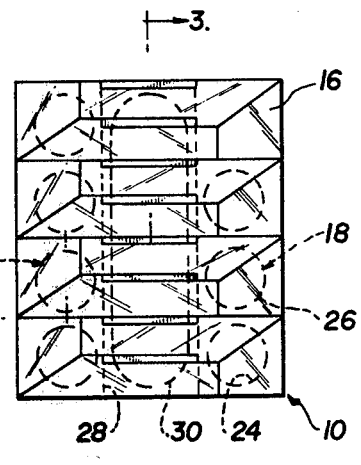
FIG. 2 is a top view of the display.
Figure 4:
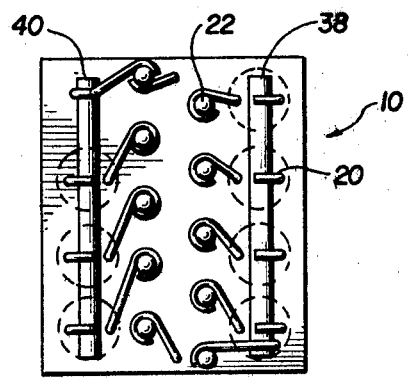
FIG. 4 is a bottom view of the display showing the connector pins for the display.
Figure 3:
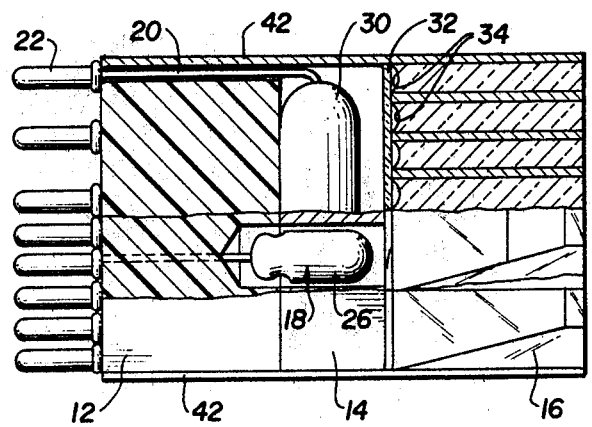
FIG. 3 is a sectional view taken along line 3—3 of the FIG. 2 and looking in the direction of the arrows.

The bar type modular display as shown in the drawings is indicated in its entirety as 10 and comprises an elongated insulating member 12, an elongated heat sink member 14 and a plurality of plastic segments 16. The insulating member 12 supports a desired number of lamps indicated generally at 18 with leads 20 extending therethrough and directly soldered to a plurality of connector pins 22 fixed within the insulating member 12.

To the insulating member 12 is fastened the metallic heat sink member 14 containing a matrix of apertures 24 to accept miniature incandescent lamps 26 and a rectangularly shaped groove 28 to accept an elongated axial lamp 30. The matrix of apertures 24 containing the individual lamps 26 are transverse the rectangular shaped groove 28 and disposed on each side thereof. In the embodiment shown there are seven such incandescent lamps 26, one for illuminating each of seven segments which make up the modular display with the eighth segment being illuminated by the axial incandescent lamp 30.

Between the metallic heat sink member 14 and the segments 16 is a colored filter 32 in order to achieve color display if colored light is desired.

The modular segments 16 are irregularly shaped and transparent with highly polished surfaces prepared with reflecting coatings where required prior to encapsulation in a potting compound to form a unitary member. These plastic segments serve as light pipes for both the individual lamps 26 and the single axial lamp 30 and are stacked one on top of the other alternately for the length of the display bar, and machined upon the front and back surfaces. The surface of each segment interfacing with the lamps and facing the heat sink are machined with concave shapes as at 34 to collect and to transmit the maximum amount of light generated by the lamps while the surface facing the viewer is finished with a matte finish to diffuse transmitted light. A dial scale 36 may be provided if desired for reference purposes.

From the foregoing, it is important to note that seven incandescent lamps are utilized together with the elongated axially disposed lamp to illuminate the eight segments under conditions requiring maximum light intensity as during daylight, while under circumstances where the light transmitted can be reduced, the seven segments can be extinguished leaving only the axial lamp to light the entire display. Thus, one lamp can light eight segments under conditions permitting minimum light generation as for example under night time conditions thus reducing the power requirements for the display.

With the connector pins 22 for the lamps connected so that one lead 26 from each of the lamps 20 connected in common with those lamps on the same side of the axial lamp by connection to the common pins 38 and 40, the connector pins 22 may then be utilized to connect the individual lamps to a connector (not shown) by which each lamp may be individually powered to form, for example, a thermometer type dot position display utilizing the scale 36 for that purpose. Also the lamps, as for example, on each side of the axial lamp may be connected to separate power supplies or the axial lamp and the miniature lamps as a group may be separately powered for redundancy purposes as taught in the co-pending application entitled "SYSTEM REDUNDANCY FOR INCANDESCENT DISPLAYS" by Z. REICH Ser. No. 817,458 and assigned to the same assignee.

Finally, while eight segments are shown closed at the ends with opaque end panels 42, the segments depend on the length of the axial lamp 30 however, any number of axial lamps may be laid end to end with a given number of individual lamps to make up a bar display of any desired length.

What is claimed is:

1. A bar type display made up of a plurality of segments disposed side-by-side forming a bar display comprising:

a plurality of incandescent lamps, one lamp for each of the segments less one for illuminating all segments but one;

an elongated incandescent lamp utilized to enhance the illumination of the plurality of segments and to illuminate the one segment not having an incandescent lamp;

said plurality of lamps being separate from the elongated lamp so that said plurality can be lit independently; and means for connecting said bar display to a source of power.

2. The display as claimed in claim 1 wherein each of said plurality of lamps are individually connected so as to be operable independently of each other.

3. The display as claimed in claim 2 wherein said elongated lamp extends the length of the entire bar display so as to illuminate all of the segments when desired even though the plurality of lamps are not illuminating their respective segments.